(12) United States Patent
Schuegraf

(10) Patent No.: US 6,972,442 B1
(45) Date of Patent: Dec. 6, 2005

(54) EFFICIENTLY FABRICATED BIPOLAR TRANSISTOR

(75) Inventor: Klaus F. Schuegraf, San Jose, CA (US)

(73) Assignee: Newport Fab, LLC, Newport Beach, CA (US)

( * ) Notice: Subject to any disclaimer, the term of this patent is extended or adjusted under 35 U.S.C. 154(b) by 259 days.

(21) Appl. No.: 10/313,583

(22) Filed: Dec. 7, 2002

Related U.S. Application Data

(62) Division of application No. 10/163,661, filed on Jun. 4, 2002, now Pat. No. 6,589,850.

(51) Int. Cl.$^7$ .................................... H01L 31/0328
(52) U.S. Cl. .................. 257/197; 257/205; 257/350; 257/477; 257/526; 257/552; 438/235; 438/309; 438/312
(58) Field of Search .................. 257/47, 197, 205, 257/273, 350, 361, 370, 378, 423, 462, 477–479, 257/511, 512, 517, 518, 525, 526, 539–543, 257/552–593; 438/905, 186, 189, 197, 202, 438/234, 235, 309, 312, FOR 165

(56) References Cited

U.S. PATENT DOCUMENTS

| | | | |
|---|---|---|---|
| 4,885,614 A | * | 12/1989 | Furukawa et al. ............ 257/76 |
| 2002/0038874 A1 | * | 4/2002 | Egashira ..................... 257/197 |

* cited by examiner

*Primary Examiner*—Evan Pert
*Assistant Examiner*—Scott R. Wilson
(74) *Attorney, Agent, or Firm*—Farjami & Farjami LLP

(57) ABSTRACT

One embodiment is a method for fabricating the base of a bipolar transistor where the method comprises placing a first wafer in an undoped epi chamber. Next a first undoped base layer is grown over the first wafer. After growing the first undoped base layer, the first wafer is transferred from the undoped epi chamber into a separate doped epi chamber. A first doped base layer is then grown over the first undoped based layer in the doped epi chamber. While the first wafer is being processed in the doped epi chamber, a second wafer can be processed in the undoped epi chamber. Another embodiment is a structure produced by the disclosed method and yet another embodiment comprises a transfer chamber, a transfer arm, a bake chamber, and a separate undoped epi chamber and a doped epi chamber for practicing the disclosed method.

13 Claims, 5 Drawing Sheets

EFFICIENTLY FABRICATED BIPOLAR TRANSISTOR

This is a divisional of application Ser. No. 10/163,661 filed Jun. 4, 2002 now U.S. Pat. No. 6,589,850.

BACKGROUND OF THE INVENTION

1. Field of the Invention

The present invention is generally in the field of semiconductor fabrication. More particularly, the present invention is in the field of fabrication of bipolar transistors.

2. Related Art

Bipolar transistors are commonly used in electronic devices and, in particular, in radio frequency applications. A particular type of bipolar transistor, which is used as an example in the present application, is the silicon-germanium ("SiGe") heterojunction bipolar transistor ("HBT") in which a thin layer of silicon-germanium is grown over the bipolar transistor's collector region to operate as the base of the bipolar transistor. The silicon-germanium HBT has significant advantages in speed, frequency response, and gain when compared to a conventional silicon-only bipolar transistor, for instance. Cutoff frequencies in excess of 100 GHz, which are comparable to the more expensive gallium-arsenide based devices, have been achieved for the silicon-germanium HBT.

The higher gain, speed and frequency response of the silicon-germanium HBT are possible due to certain advantages of silicon-germanium, such as a narrower band gap and reduced resistivity. These advantages make silicon-germanium devices more competitive than silicon-only devices in areas of technology where superior speed and frequency response are required.

Reference is now made to FIG. 1, which illustrates bipolar structure 100, which in the present example is a silicon-germanium HBT structure. As shown, structure 100 includes, among other components, collector 130, silicon-germanium base 120, and emitter 140. In structure 100, collector 130 is N type single-crystal silicon and base 120 is P type single-crystal silicon-germanium. As will be discussed in greater detail below, base 120 can be fabricated epitaxially, for example, in a reduced pressure chemical vapor deposition process ("RPCVD"), to grow a silicon-germanium film over top surface 132 of collector 130. A suitable dopant, such as boron, is typically introduced during the silicon-germanium film growth to attain the desired electrical properties of the base.

Continuing with FIG. 1, structure 100 further includes emitter 140, which is situated above and forms a junction with base 120, and which is comprised of N type polycrystalline silicon. The interface between emitter 140, base 120, and collector 130 is the active region of the NPN silicon-germanium HBT, i.e., structure 100. In structure 100, dielectric segments 142 provide electrical isolation to emitter 140 from base 120.

As further illustrated in FIG. 1, buried layer 134, which is composed of N+ type material, is formed in semiconductor substrate 110. Collector sinker 136, also composed of N+ type material, is formed by diffusion of heavily concentrated dopants from the surface of collector sinker 136 down to buried layer 134. Buried layer 134 and collector sinker 136 provide a low resistance electrical pathway from collector 130 through buried layer 134 and collector sinker 136 to a collector contact (not shown). Deep trench structures 133 and field oxide regions 138 provide electrical isolation from other devices on semiconductor substrate 110.

Referring now to FIG. 2, graph 200 illustrates the doping profile of the base in an exemplary silicon-germanium HBT, such as the NPN silicon-germanium HBT structure of structure 100 in FIG. 1. In graph 200, y-axis 202 plots the concentration level of materials (e.g., germanium and other dopants) that are deposited along with silicon over the collector as part of growing the base, and x-axis 204 plots the thickness of the base as the deposition proceeds. Thus, the origin (i.e., the intersection of y-axis 202 and x-axis 204) of graph 200 corresponds to the top surface of the collector over which the silicon-germanium base is grown, at the point where fabrication of the base is to begin with the deposition of silicon only.

Continuing with FIG. 2, at point A on x-axis 204, germanium is introduced into the deposition process and grows along with the silicon over the collector. Profile 206 illustrates the doping profile of the germanium. At point B, a suitable dopant is introduced into the mix with the silicon and germanium, and the concentration level of the dopant is shown by profile 208. The dopant can be boron, for example. By the time the thickness of the base reaches point C, the germanium has been ramped down, and the deposition then continues with silicon and the dopant only. Finally, at point D, the growth of the base in the present example is complete and, as such, point D corresponds to the interface between the base and emitter.

Conventional methods for growing the base in a bipolar transistor generally involve a series of steps. In one approach used for forming the silicon-germanium base in a SiGe HBT, for example, a wafer having a transistor region over which the silicon-germanium base is to be grown is initially baked in a reactor chamber at approximately 900° C. for approximately five minutes. Subsequently, the chamber is cooled down to between 600° C. and 750° C. so that the desired base materials, for example silicon-germanium and boron, can be deposited. According to this method, the formation of the base typically requires between approximately five and ten minutes to complete, after which time the wafer is removed from the reactor chamber.

Once the base has been formed and the completed wafer has been removed, the chamber has to undergo extensive conditioning in preparation for the next wafer. The conditioning is necessary due to, for instance, the accumulation of materials on the chamber wall from previous deposition procedures that can adversely impact the processing of subsequent wafers. More specifically, a primary concern is the presence of residual dopant materials, such as boron, on the chamber walls which can contaminate subsequent wafers and compromise the electrical properties of the base layer formed on these subsequent wafers.

To eliminate the threat of contaminating subsequent wafers, a chamber etching step is needed after the processing of each wafer to remove the undesired materials from the chamber. Typically, the chamber temperature has to be raised to approximately 1100° C., and an etchant, for example HCl gas, is supplied to etch the dopant or undesired materials, along with the silicon and germanium, from the chamber walls. Once the chamber has been cleaned, the etchant is evacuated out of the chamber. The chamber temperature has to then be lowered to approximately 900° C. before the next wafer can be processed.

The need to clean the chamber after each wafer introduces a significant time and cost budget on manufacturers. The time required to clean the chamber translates to lower throughput and productivity and to higher manufacturing cost. Some manufacturers have tried to increase throughput by, for example, baking the wafers in a separate bake chamber and coupling the bake chamber to multiple epi chambers, wherein deposition of the base can occur. In this manner, wafers can be processed more quickly since one epi chamber can be depositing while the other epi chamber is being cleaned. The separate bake chamber supplies a steady number of wafers to the epi chambers. However, with this approach, an epi chamber still needs to be cleaned after every wafer to remove the undesired materials accumulated on the chamber walls. Manufacturers have also tried to increase production by simply investing in more equipment, such as more epi and bake chambers. Approaches known currently, however, remain inefficient. Whether due to lower throughput or due to higher costs as a consequence of the need for more equipment, conventional processing methods impose significant burdens on manufacturers.

There is thus a need in the art for an approach for fabricating bipolar transistors, such as SiGe HBT transistors, that is more efficient than conventional approaches, and which will increase throughput without imposing additional significant costs.

SUMMARY OF THE INVENTION

The present invention is directed to method and system for fabricating a bipolar transistor and related structure. The present invention overcomes the need in the art for an approach for fabricating bipolar transistors, such as a silicon-germanium ("SiGe") heterojunction bipolar transistor ("HBT"), that is more efficient than conventional approaches, and which will increase throughput without imposing additional significant costs.

In one exemplary embodiment, the invention is a method for fabricating the base of a bipolar transistor where the method comprises placing a first wafer in an undoped epi chamber. In one implementation, the first wafer is baked in a separate bake chamber prior to placing it (i.e. the first wafer) in the undoped epi chamber. Next a first undoped base layer is grown over the first wafer. As an example, the first undoped base layer can comprise a SiGe layer when the exemplary bipolar transistor is a SiGe HBT. After growing the first undoped base layer, the first wafer is transferred from the undoped epi chamber into a separate doped epi chamber. A first doped base layer is then grown over the first undoped based layer in the doped epi chamber. In one implementation, the dopant might be boron. Moreover, while the first wafer is being processed in the doped epi chamber, a second wafer can be processed in the undoped epi chamber.

In a related embodiment, the invention is a structure produced by the above method and, in yet another embodiment, the invention comprises a transfer chamber, a transfer arm, a bake chamber, and a separate undoped epi chamber and a doped epi chamber for practicing the invention's method. In a manner described in more detail below, the present invention results in a fabrication approach that is more efficient than conventional fabrication techniques, and which will increase throughput without imposing additional significant costs. Other features and advantages of the present invention will become more readily apparent to those of ordinary skill in the art after reviewing the following detailed description and accompanying drawings.

DETAILED DESCRIPTION OF THE INVENTION

The present invention is directed to method and system for fabricating a bipolar transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to mere example embodiments of the invention. To maintain brevity, other embodiments utilizing the principles of the present invention are not specifically described in the present application and are not specifically illustrated by the present drawings.

Figure 3:
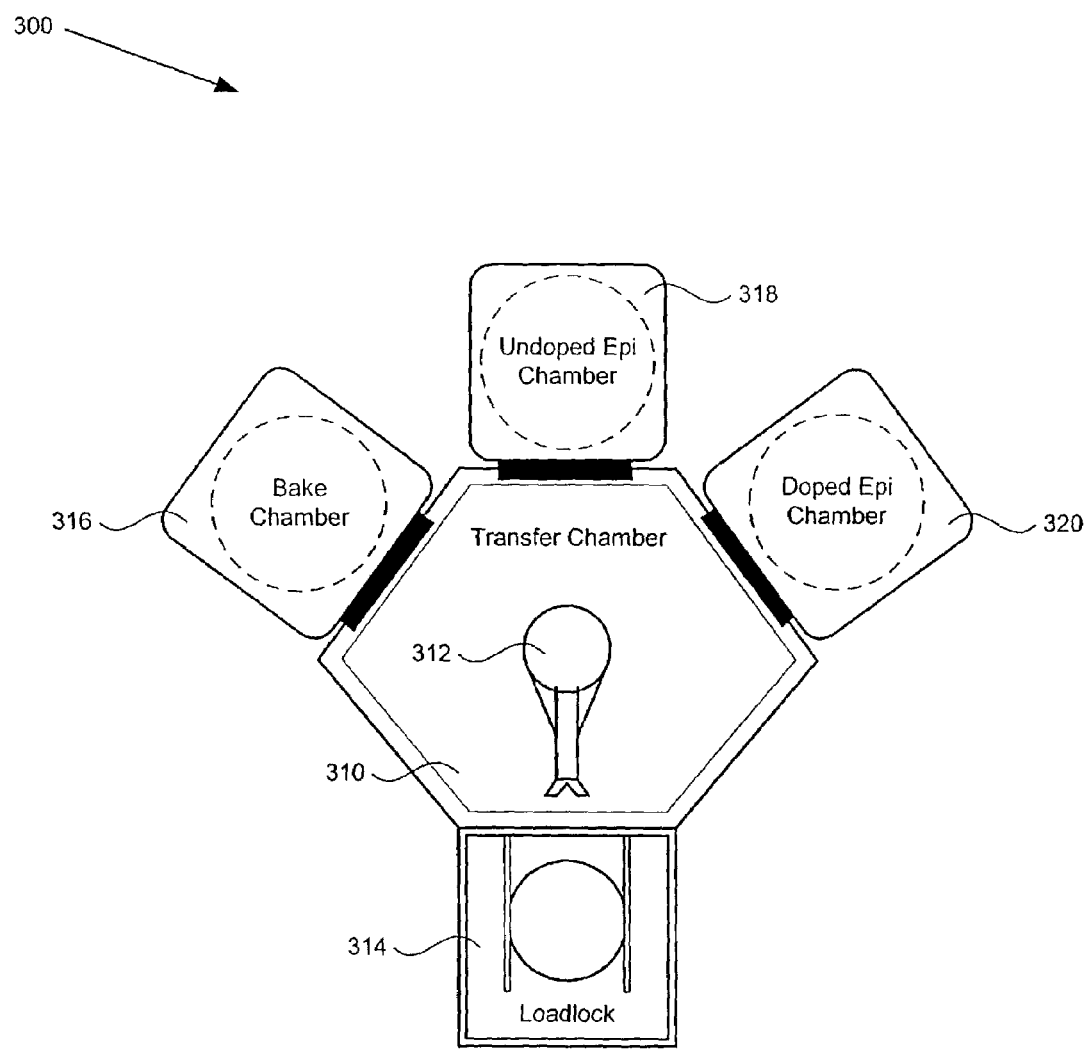
FIG. 3 illustrates a system for growing a base in a bipolar transistor in accordance with one embodiment of the present invention.

Illustrated in FIG. 3 is exemplary wafer processing system 300, which is used to describe the fabrication of an exemplary base in an exemplary bipolar transistor, in accordance with one embodiment of the present invention. In the present application, an exemplary silicon-germanium ("SiGe") base in a SiGe heterojunction bipolar transistor ("HBT") is used for the purpose of illustrating the invention's concepts by referring to specifics. However, it is apparent to an artisan of ordinary skill that the concepts and techniques of the present invention applies also to bipolar transistors other than SiGe HBTs and that the invention is not limited to the specific examples provided in the present application. Moreover, certain details and features, which are apparent to a person of ordinary skill in the art, have been left out of FIG. 3 in order not to obscure the concepts of the present invention.

As shown in FIG. 3, system 300 includes transfer chamber 310, in which is situated transfer aim 312. Loadlock 314 is attached to transfer chamber 310 and contains wafers awaiting further processing. For example, loadlock 314 may have end-patterned wafers comprising transistor regions over which the base is to be fabricated. It is to be understood that end-patterned wafers comprise, among other features, transistor regions having components of a bipolar transistor prior to the formation of a base layer over the transistor regions. For example, the bipolar transistor can include a collector, certain oxide and isolation regions, and other components known generally to those in the art. Wafers in loadlock 314 can be picked up and handled by transfer arm 312.

Continuing with FIG. 3, system 300 further includes bake chamber 316, "undoped" epi chamber 318, and "doped" epi chamber 320 connected to transfer chamber 310. Bake chamber 316 can be any suitable bake chamber known in the art configured for baking wafers. Similarly, undoped epi chamber 318 and doped epi chamber 320 can be suitable reactors known in the art, in which materials for the base can be deposited. For example, undoped epi chamber 318 and doped epi chamber 320 can be configured for chemical vapor deposition ("CVD") and/or related deposition methods. The temperature of undoped epi chamber 318 and doped epi chamber 320 can be maintained at a desired temperature to facilitate deposition of the base materials.

In the present embodiment, transfer arm 312 can transfer an end-patterned wafer from loadlock 314 and place the wafer in bake chamber 316 to be baked. The temperature of bake chamber 316 can be maintained separately from undoped epi chamber 318 and doped epi chamber 320. As such, for the purpose of preparing the wafer for base fabrication, the temperature of bake chamber 316 can be maintained at between approximately 800° C. and 1000° C., for example. After a wafer has been in bake chamber 316 for a sufficient length of time, transfer arm 312 can transfer the wafer to undoped epi chamber 318.

In undoped epi chamber 318, fabrication of the base starts when a first semiconductor, such as silicon, is introduced into epi chamber 318 and begins growing over the end-patterned wafer, including over the transistor regions of the wafer. At a desired point (see, e.g., point A in graph 200), a second semiconductor, such as germanium, may be introduced and grown with the first semiconductor over the wafer. As the deposition process progresses, the relative concentrations of the first and second semiconductor materials can be controlled in a manner known in the art. Other materials, such as carbon, may also be introduced into epi chamber 318 and grown with the semiconductor materials.

At the point in the base fabrication process where introduction of the base dopant material is to occur (for example, at point B in graph 200), the deposition process in undoped epi chamber 318 ends. In other words, no dopant is introduced into undoped epi chamber 318. As a result, the film deposited over the wafer in undoped epi chamber 318 comprises undoped semiconductor material, and the material formed on the walls of undoped epi chamber 318 likewise consists of only semiconductor(s). It is noted that the undoped semiconductor film deposited over the transistor regions of the wafer as part of the base fabrication process is also referred to as an "undoped base layer" in the present application.

Once the undoped base layer has been formed in undoped epi chamber 318, transfer arm 312 can transfer the wafer to doped epi chamber 320, wherein more materials, including the base dopant, are deposited to complete fabrication of the base. Thus, in doped epi chamber 320, deposition may begin with the introduction of the desired concentrations of semiconductor materials and the dopant into doped epi chamber 320. In the example of a silicon-germanium HBT, the semiconductor materials can comprise silicon and germanium, while the dopant can be boron, for example. In certain embodiments, other materials, such as carbon, may also be introduced into doped epi chamber 320 and grown with the semiconductor materials and the dopant. The relative concentrations of the materials introduced into doped epi chamber 320 can be controlled to achieve the desired electrical properties for the base. From the process performed in doped epi chamber 320, a second, or "doped," base layer comprising the semiconductor materials and the dopant material is grown over the undoped base layer formed in undoped epi chamber 318. It is appreciated that the doped base layer may also comprise other materials, such as carbon, in some embodiments.

As part of the deposition process performed in doped epi chamber 320, the materials introduced into doped epi chamber 320 accumulate on the walls of doped epi chamber 320, in addition to growing on the base layer. Consequently, the walls of doped epi chamber 320 may be blanketed with residual dopant material, following formation of the doped base layer. However, because doped epi chamber 320 is used only for growing the doped base layer, and not the undoped base layer, the presence of dopants on the walls of epi chamber 320 has little effect on the processing of a subsequent wafer in doped epi chamber 320. Stated differently, even if some of the residual dopant materials on the walls of epi chamber 320 should ultimately deposit onto a subsequent wafer as part of the doped base layer, the impact on the resulting base would be minimal, because the dopant is a desired constituent of the doped base layer.

Thus, by fabricating the base of a bipolar transistor in individual steps whereby undoped and doped layers of the base are grown separately in separate chambers, the present invention achieves greater throughput than conventional bipolar transistor fabrication techniques. The increase in throughput is possible because the threat of residual dopant materials on the chamber walls depositing uncontrollably and contaminating the base is averted, since the dopant material is introduced into only the epi chamber where the doped base layer is grown. At the same time, there is no residual dopant material in the undoped epi chamber to contaminate the undoped base layer. An advantage of the present invention, therefore, is that the chambers do not have to be cleaned or conditioned as frequently as conventional fabrication methods. As a result, the present invention achieves greater throughput and substantially reduces manufacturing costs.

Figure 4:
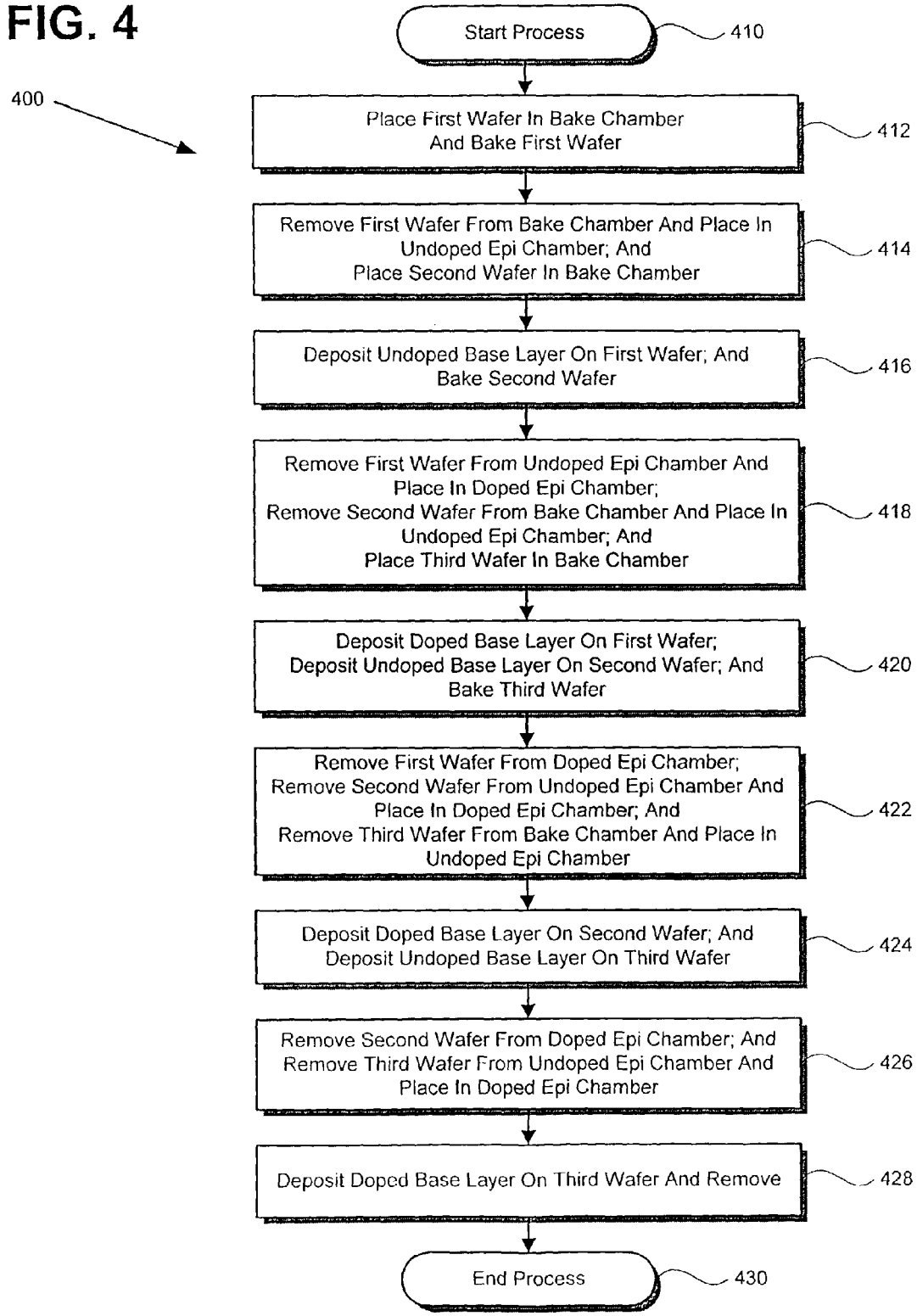
FIG. 4 shows a flowchart illustrating some exemplary steps taken to implement an embodiment of the invention.

Reference is now made to FIG. 4, illustrating exemplary process 400 for fabricating wafers and for growing the base of a bipolar transistor, such as a silicon-germanium HBT, in accordance with one embodiment of the present invention. Certain details and steps have been left out of process 400 which are apparent to a person of ordinary skill in the art. For example, a step may consist of one or more substeps or may involve specialized equipment, as known in the art. Process 400 begins at step 410 and continues to step 412 where transfer arm 312 places a first wafer comprising transistor regions over which a base is to be fabricated in bake chamber 316 to be baked. For example, a wafer placed in bake chamber 316 can be baked for between approximately one and five minutes at between approximately 800° C. and approximately 1000° C.

Next, at step 414 of process 400, transfer arm 312 removes the first wafer from bake chamber 316 and places it (i.e. the first wafer) in undoped epi chamber 318, and a second wafer is placed in bake chamber 316 by transfer arm 312. At step 416, an undoped base layer is deposited over the first wafer in undoped epi chamber 318. The undoped base layer comprises semiconductor materials, such as silicon and germanium, for example. In some embodiments, other materials, such as carbon, may also be deposited as part of the undoped base layer. Also at step 416, the second wafer is baked in bake chamber 316. Thereafter, at step 418, transfer arm 312 removes the first wafer from undoped epi chamber 318 and places it (i.e. the first wafer) in doped epi chamber 320, while the second wafer is transferred into undoped epi chamber 318 by transfer arm 312, and while a third wafer is placed in bake chamber 316 by transfer arm 312.

A doped base layer is then deposited over the undoped base layer of the first wafer in doped epi chamber 320 at step 420. In the present embodiment, the doped base layer comprises semiconductor materials, such as silicon and germanium, and a desired dopant, such as boron. In some embodiments, the doped base layer may also comprise other materials, such as carbon. Also at step 420, an undoped layer is grown over the second wafer in undoped epi chamber 318, and the third wafer is baked in bake chamber 316. Process 400 then proceeds to step 422 where the first wafer, now having a base comprising an undoped layer and a doped layer, is removed from doped epi chamber 320 by transfer arm 312. Further processing of the first wafer subsequent to step 422 can be performed in a manner known in the art and is not discussed in detail here. At step 422, the second wafer is removed from undoped epi chamber 318 and transferred to doped epi chamber 320 by transfer arm 312, while the third wafer is removed from bake chamber 316 and placed in undoped epi chamber 318 by transfer arm 312.

Process 400 continues at step 424 where a doped base layer is deposited in doped epi chamber 320 over the undoped base layer of the second wafer. Also, at step 424, an undoped base layer is formed over the third wafer in undoped epi chamber 318. Next, at step 426 of process 400, the second wafer having a base comprising an undoped base layer and a doped base layer is removed from doped epi chamber 320 by transfer arm 312, while the third wafer is transferred from undoped epi chamber 318 to doped epi chamber 320 by transfer arm 312. Then, at step 428, a doped base layer is deposited over the undoped base layer of the third wafer in doped epi chamber 320, following which the third wafer is removed from doped epi chamber 320. Process 400 then ends at step 430.

Figure 1:
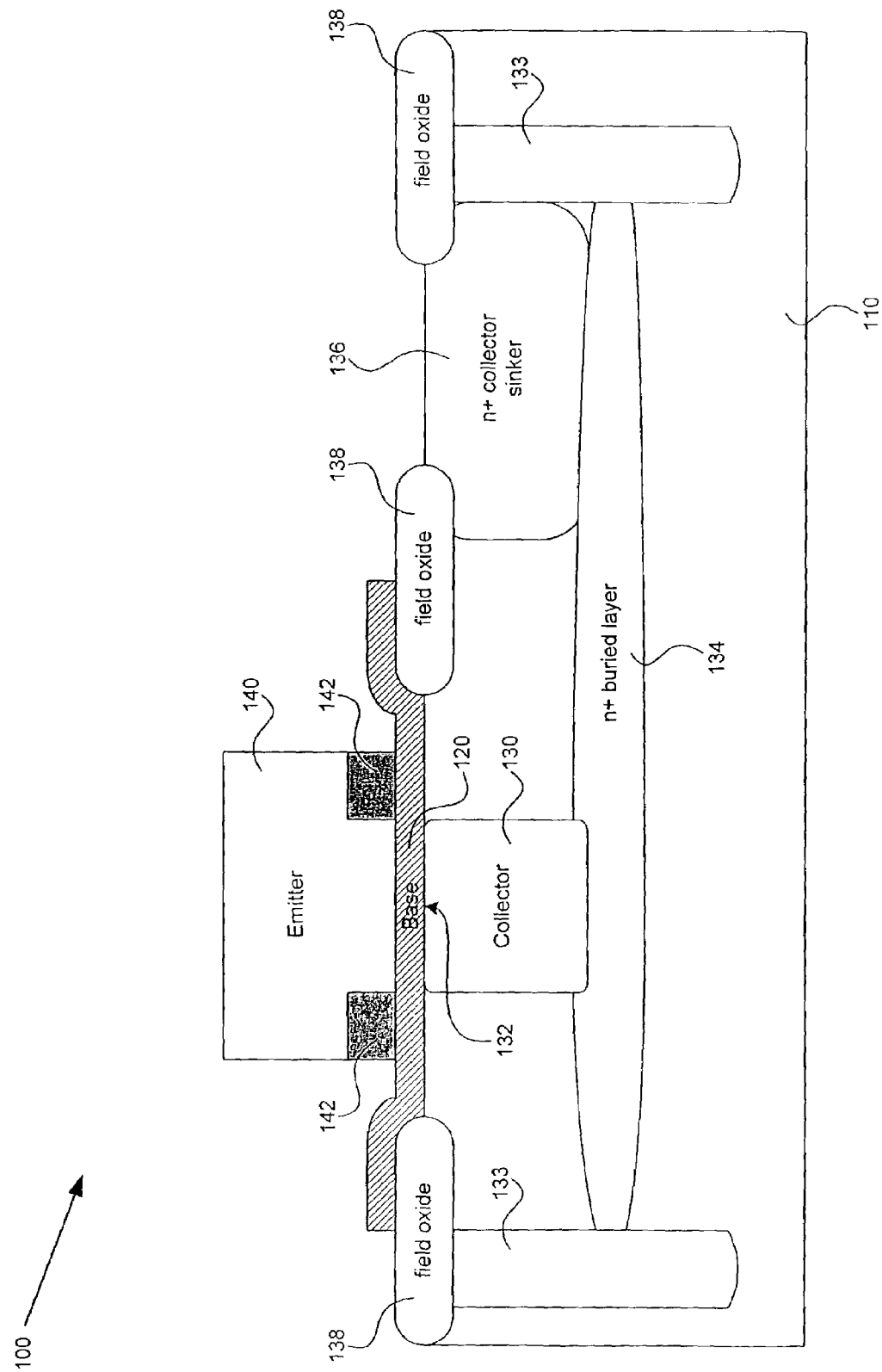
FIG. 1 illustrates a cross sectional view of some of the features of a bipolar transistor fabricated utilizing conventional methods.
Figure 2:
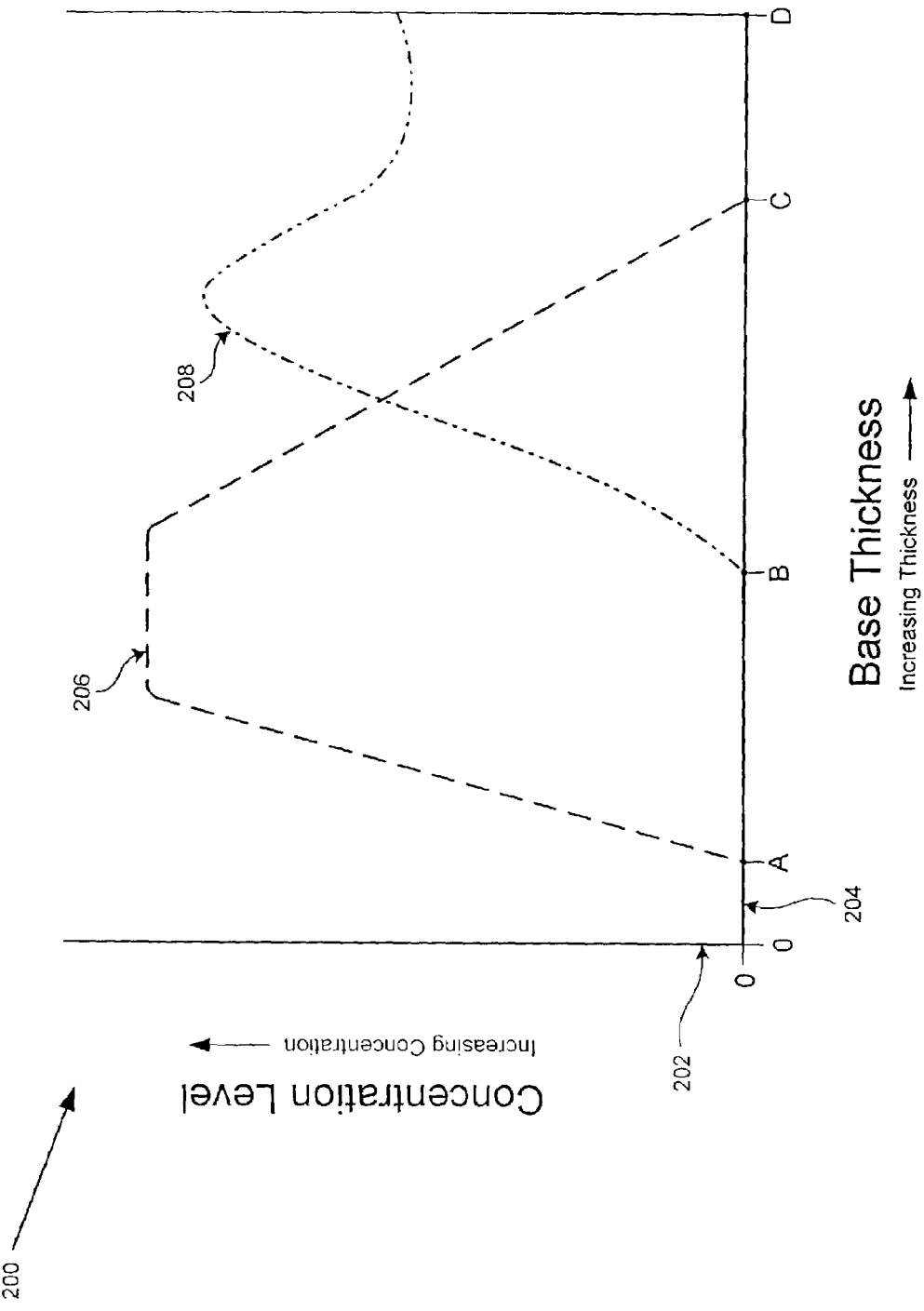
FIG. 2 shows the doping profile of one type of bipolar transistor.
Figure 5:
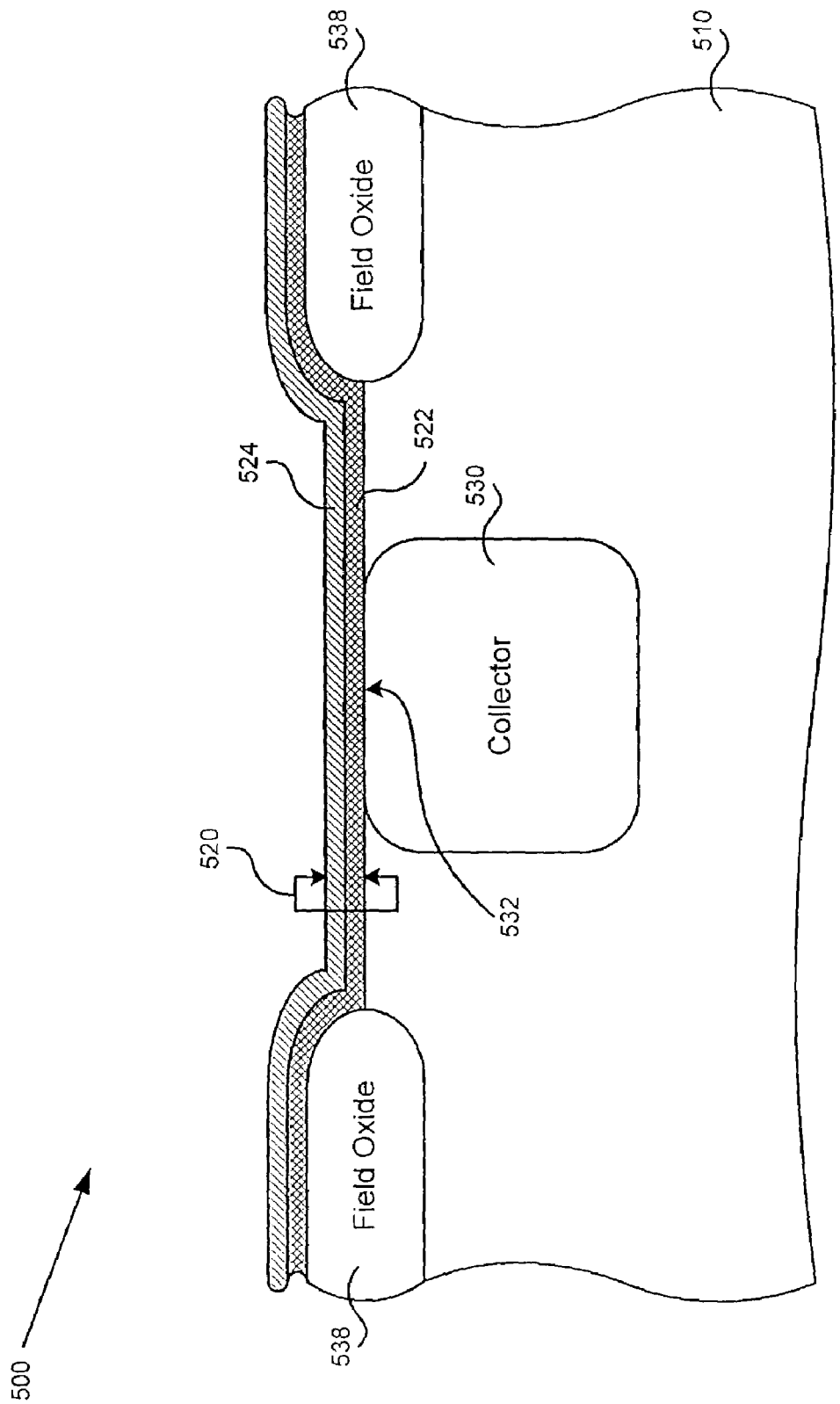
FIG. 5 illustrates a cross sectional view of some of the features of a bipolar transistor fabricated in accordance with one embodiment of the present invention.

Referring now to FIG. 5, exemplary structure 500 is used to describe fabrication of a base in a bipolar transistor, such as a silicon-germanium HBT, in accordance with one embodiment. Certain details and features have been left out of FIG. 5 which are apparent to a person of ordinary skill in the art. As shown, structure 500 comprises collector 530 having top surface 532 formed in substrate 510. Structure 500 further includes field oxides 538. It is appreciated that collector 530 having top surface 532, substrate 510, and field oxides 538 in structure 500 are respectively equivalent to collector 130 having top surface 132, substrate 110, and field oxides 138 in structure 100 illustrated in FIG. 1.

Continuing with FIG. 5, it is shown in structure 500 that base 520 is made up of two separate layers, i.e., undoped base layer 522 and doped base layer 524. Undoped base layer 522 in the present embodiment comprises semiconductor materials only, while doped base layer 524 comprises semiconductor materials doped with a desired dopant. The semiconductor materials in undoped and doped base layers 522 and 524 can comprise silicon and germanium, while the dopant in doped base layer 524 can be boron, for example. In some embodiments, base 520 may comprise additional materials, such as carbon.

It is appreciated that base 520 can be fabricated according to the steps of process 400 in FIG. 4, which can be performed by system 300 in FIG. 3. In other words, undoped base layer 522 may be formed first in undoped epi chamber 318 wherein only semiconductor materials are deposited, and doped base layer 524 may be separately formed in doped epi chamber 320, wherein a dopant such as boron is deposited along with the semiconductor materials. It is appreciated that further processing, including the fabrication of an emitter over base 520, results in a bipolar transistor.

From the above description of the invention it is manifest that various techniques can be used for implementing the concepts of the present invention without departing from its scope. Also, it is appreciated that certain details have been left out in order to not obscure the invention but that these details are known to those of skill in the art. Moreover, while the invention has been described with specific reference to certain embodiments, a person of ordinary skills in the art would appreciate that changes can be made in form and detail without departing from the spirit and the scope of the invention. For example, although the application has referred occasionally to the silicon-germanium HBT structure, it will be apparent to a person of ordinary skill in the art how the invention can be applied in similar situations where greater throughput and lower costs are desired in fabricating bipolar transistors.

The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method and system for fabricating a bipolar transistor and related structure have been described.

What is claimed is:

1. A structure comprising:
   a collector;
   an undoped base layer situated over said collector, said undoped base layer grown in an undoped epi chamber;
   a doped base layer situated over said undoped base layer, said doped base layer grown in a doped epi chamber;
   wherein said undoped epi chamber prevents said undoped base layer from being contaminated by residual dopant material.

2. The structure of claim 1 wherein said undoped base layer comprises silicon-germanium.

3. The structure of claim 1 wherein said doped base layer comprises silicon-germanium doped with a dopant.

4. The structure of claim 3 wherein said dopant is boron.

5. The structure of claim 1 further comprising an emitter situated over said doped base layer.

6. The structure of claim 1 wherein said undoped base layer and said doped base layer are grown using a chemical vapor deposition process.

7. A structure comprising:
   a collector;
   a base comprising an undoped base layer and a doped base layer;
   said undoped base layer situated over said collector, said undoped base layer grown in an undoped epi chamber;
   said doped base layer situated over said undoped base layer, said doped base layer grown in a doped epi chamber;
   wherein said undoped base layer comprises silicon-germanium;
   wherein said undoped epi chamber prevents said undoped base layer from being contaminated by residual dopant material.

8. The structure of claim 7 wherein said doped base layer comprises silicon-germanium doped with a dopant.

9. The structure of claim 8 wherein said dopant is boron.

10. The structure of claim 7 wherein said base comprises carbon.

11. The structure of claim 7 further comprising an emitter situated over said doped base layer.

12. The structure of claim 11 wherein said emitter, said base, and said collector form a heterojunction bipolar transistor.

13. The structure of claim 7 wherein said undoped base layer and said doped base layer are grown using a chemical vapor deposition process.

* * * * *